United States Patent
Yuasa et al.

(10) Patent No.: US 11,486,613 B2
(45) Date of Patent: Nov. 1, 2022

(54) POWER CONVERTER AND AIR-CONDITIONING APPARATUS EMPLOYING THE SAME

(71) Applicant: Mitsubishi Electric Corporation, Tokyo (JP)

(72) Inventors: Kenta Yuasa, Tokyo (JP); Yoshihiro Taniguchi, Tokyo (JP); Yoshikazu Nozuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 842 days.

(21) Appl. No.: 16/330,579

(22) PCT Filed: Nov. 11, 2016

(86) PCT No.: PCT/JP2016/083587
§ 371 (c)(1),
(2) Date: Mar. 5, 2019

(87) PCT Pub. No.: WO2018/087893
PCT Pub. Date: May 17, 2018

(65) Prior Publication Data
US 2020/0083820 A1    Mar. 12, 2020

(51) Int. Cl.
*F25B 31/02*    (2006.01)
*H02P 27/06*    (2006.01)

(52) U.S. Cl.
CPC .............. *F25B 31/02* (2013.01); *H02P 27/06* (2013.01); *H02P 2201/03* (2013.01)

(58) Field of Classification Search
CPC .......... H02P 27/00; H02P 27/04; H02P 27/06; H02P 1/00; H02P 1/04; H02P 1/16;
(Continued)

(56) References Cited

U.S. PATENT DOCUMENTS 7,964,911 B2 *  6/2011  Kitabatake .......... H01L 29/7811
                                                        257/341
2004/0161975 A1  8/2004  Sakai et al.
(Continued)

FOREIGN PATENT DOCUMENTS

EP    1 174 992 A2    1/2002
EP    2 496 060 A1    9/2012
(Continued)

OTHER PUBLICATIONS

International Search Report of the International Searching Authority dated Dec. 6, 2016 for the corresponding international application No. PCT/JP2016/083587 (and English translation).
(Continued)

*Primary Examiner* — Antony M Paul
(74) *Attorney, Agent, or Firm* — Posz Law Group, PLC

(57) ABSTRACT

A power converter includes a first substrate on which a module including a switching element is mounted, a second substrate on which a smoothing capacitor is mounted, and a terminal block connecting the first substrate and the second substrate, with the first and second substrates located to face each other. The terminal block includes a current path over which at least one of current flowing from the module to the smoothing capacitor and current flowing from the smoothing capacitor to the module flows.

9 Claims, 5 Drawing Sheets

(58) Field of Classification Search
CPC .... H02P 1/163; H02P 1/18; H02P 1/24; H02P 1/26; H02P 1/42; H02P 1/44; H02P 1/445; H02P 1/46; H02P 1/465; H02P 3/00; H02P 6/00; H02P 6/28; H02P 7/00; H02P 7/05; H02P 7/292; H02P 11/00; H02P 11/04; H02P 11/06; H02P 21/00; H02P 21/22; H02P 23/26; H02P 25/00; H02P 25/062; H02P 25/064; H02P 29/00; H02P 2201/07; H02P 2201/09; H02P 2201/05; H02P 3/07
See application file for complete search history.

(56) References Cited

U.S. PATENT DOCUMENTS

| | | | |
|---|---|---|---|
| 2007/0109715 A1* | 5/2007 | Azuma | B60L 50/40 361/299.3 |
| 2009/0091892 A1 | 4/2009 | Otsuka et al. | |
| 2010/0178813 A1 | 7/2010 | Holbrook | |
| 2014/0015452 A1 | 1/2014 | Nagase et al. | |

FOREIGN PATENT DOCUMENTS

| | | |
|---|---|---|
| JP | 2005-150161 A | 6/2005 |
| JP | 2007-037211 A | 2/2007 |
| JP | 2010-187504 A | 8/2010 |
| JP | 2012-077721 A | 4/2012 |
| JP | 2013-239512 A | 11/2013 |
| JP | 2014-023181 A | 2/2014 |

OTHER PUBLICATIONS

Office Action dated Jul. 7, 2020 issued in corresponding CN patent application No. 201680090618.9 (and English translation).
Extended European Search Report dated Oct. 21, 2019 for the corresponding EP application No. 16921202.4.

* cited by examiner

POWER CONVERTER AND AIR-CONDITIONING APPARATUS EMPLOYING THE SAME

CROSS REFERENCE TO RELATED APPLICATION

This application is a U.S. national stage application of PCT/JP2016/083587 filed on Nov. 11, 2016, the contents of which are incorporated herein by reference.

TECHNICAL FIELD

The present invention relates to a power converter including a switching element and an air-conditioning apparatus employing the power converter.

BACKGROUND ART

Refrigerating and air-conditioning apparatuses include inverter devices each of which has a great capacity, and drives a motor of, for example, a compressor or a fan. In the inverter device, a three-phase full-wave rectification type converter is provided, and includes a three-phase rectifier which rectifies a three-phase AC voltage, a reactor and a smoothing capacitor which smooth an output voltage of the three-phase rectifier, and an inverter circuit which converts a voltage of the smoothing capacitor into an AC voltage and drives a motor. Some of three-phase full-wave rectification type converters include a boost converter which causes an output voltage of the three-phase rectifier to be raised by chopping, and a switching control unit which controls a switching element of the boost converter, in order to improve the power factor of a power supply and harmonics generated in supplied current.

In the case where such an inverter device is made to have various functions, and as a result the number of elements thereof to be mounted is increased, there is a case where not all the elements of the inverter device cannot be mounted on a single substrate. As an example of countermeasures against such a problem, Patent Literature 1 describes a configuration in which elements are dividedly mounted on two substrates, and the substrates are connected to each other by lines. As another example of the countermeasures, Patent Literature 2 describes a configuration in which signal paths of two substrates are connected by a connector.

CITATION LIST

Patent Literature

Patent Literature 1: Japanese Unexamined Patent Application Publication No. 2010-187504
Patent Literature 2: Japanese Unexamined Patent Application Publication No. 2005-150161

SUMMARY OF INVENTION

Technical Problem

In an inverter device disclosed in Patent Literature 1, two substrates are arranged side by side on the same plane. To be more specific, a substrate on which smoothing capacitors are mounted and a substrate on which a module is mounted are separated from each other by a long distance, as a result of which lines between these substrates is long. This causes an increase in a surge voltage which is generated due to L (di/dt). Furthermore, there is a case where the two substrates cannot be arranged side by side on the same plane because of limitations of space in an apparatus in which the inverter device is provided.

Patent Literature discloses a structure which includes printed wiring boards connected to each other, and in which a connector is used to connect transmission paths for electrical signals between the boards. However, such a connector cannot be used in a circuit through which a large current flows, such as an inverter circuit or a boost converter circuit.

The present invention has been made to solve the above problems, and aims to provide a power converter which can reduce a surge voltage caused by an impedance, and allows a large current to flow between substrates, and also to provide an air-conditioning apparatus employing the power converter.

Solution to Problem

A power converter according to an embodiment of the present invention includes: a first substrate on which a module including a switching element is mounted; a second substrate on which a smoothing capacitor is mounted; and a terminal block connecting the first and second substrates, with the first and second substrates located to face each other. The terminal block includes a current path over which at least one of current flowing from the module to the smoothing capacitor and current flowing from the smoothing capacitor to the module flows.

Advantageous Effects of Invention

According to the embodiment of the present invention, the first and second substrates facing each other are connected by the terminal block, thereby allowing a large current to flow between the substrates, and reducing the length of the current path between the substrates. It is therefore possible to decrease the impedance between the substrates, thus reducing a surge voltage which is generated due to the impedance.

DESCRIPTION OF EMBODIMENTS

Embodiment 1

Figure 1:
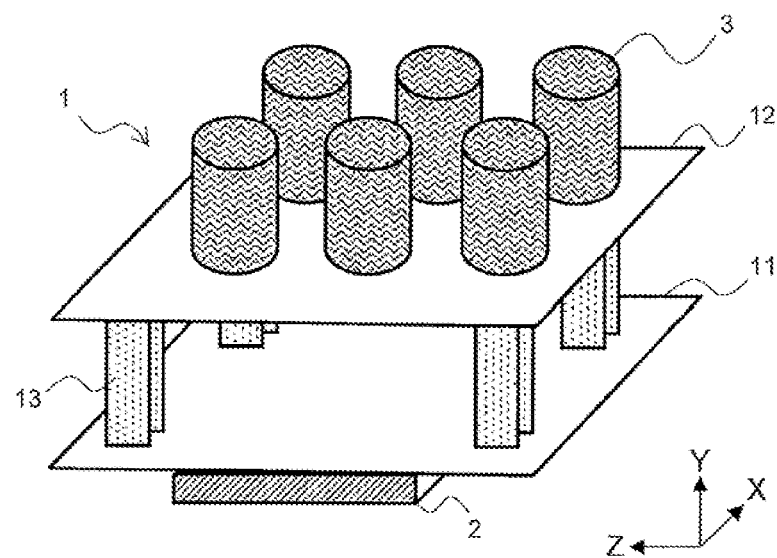
FIG. 1 is a perspective view illustrating an example of the configuration of a power converter according to embodiment 1 of the present invention.
Figure 2:
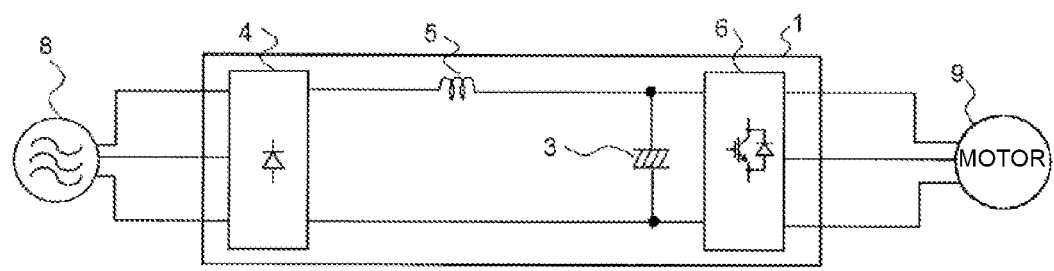
FIG. 2 is a circuit diagram illustrating the example of the configuration of the power converter as illustrated in FIG. 1.

The configuration of a power converter according to embodiment 1 will be described with reference to the drawings. FIG. 1 is a perspective view illustrating an example of the configuration of the power converter according to embodiment 1 of the present invention. FIG. 2 is a circuit diagram illustrating the example of the configuration of the power converter as illustrated in FIG. 1.

As illustrated in FIG. 1, a power converter 1 includes a first substrate 11 on which a module 2 is mounted, a second substrate 12 on which smoothing capacitors 3 are mounted, and terminal blocks 13 connecting the first and second substrates 11 and 12. The first and second substrates 11 and 12 are provided to face each other such that substrate surfaces of the substrates are parallel to each other. The terminal blocks 13 function to physically and electrically connect the two substrates. In FIG. 1, depiction of wiring patterns provided on the first and second substrates 11 and 12 is omitted. Also, in FIG. 1, depiction of circuit elements other than the smoothing capacitors 3 is omitted.

The power converter 1 as illustrated in FIG. 1 is connected to a load such as a motor of, for example, a compressor or a fan included in an air-conditioning apparatus. The power converter 1 supplies an AC having a predetermined frequency to the load. FIG. 2 illustrates the case where the load connected to the power converter 1 is a motor 9.

As illustrated in FIG. 2, the power converter 1 includes a rectifier 4, a reactor 5, the smoothing capacitors 3 and an inverter 6. The rectifier 4, the reactor 5 and the inverter 6 are provided on the first substrate 11. The module 2 as illustrated in FIG. 1 includes, for example, the inverter 6.

The rectifier 4 is an AC/DC converter which rectifies a three-phase AC voltage (for example, AC 200 V) applied from a power supply 8. The rectifier 4 is, for example, a three-phase full-wave rectifier including six diodes connected in a bridge configuration. The rectifier 4 outputs a rectified voltage.

The reactor 5 is connected to an output terminal of the rectifier 4, and also to smoothing capacitors 3. The smoothing capacitors 3 are located at the rear of the reactor 5. The smoothing capacitors 3 are, for example, electrolytic capacitors.

The inverter 6 converts DC power, which is smoothed by the smoothing capacitors 3 and supplied by charging by the smoothing capacitors 3, into AC power. The inverter 6 is made up of a plurality of switching elements. The inverter 6 supplies an AC having a predetermined frequency to, for example, the motor 9. The operation of the inverter 6 is controlled by an inverter control unit (not illustrated).

Both or either of the inverter 6 and the rectifier 4 is a device which is formed in a wide bandgap semiconductor such as silicon carbide (SiC), gallium nitride (GaN) or diamond, that has a bandgap wider than that of, for example, silicon (Si).

The inverter 6 and the rectifier 4 are not limited to devices formed in wide bandgap semiconductors. The inverter 6 and the rectifier 4 may be each formed of a semiconductor device such as a metal oxide semiconductor field effect transistor (MOSFET) or an insulated gate bipolar transistor (IGBT). As the diodes included in the rectifier 4, for example, fast recovery diodes may be used. If the power converter 1 includes a boost converter which raises an output voltage of the rectifier 4 by chopping, a switching element of the boost converter may be provided in the module 2.

Figure 3A:
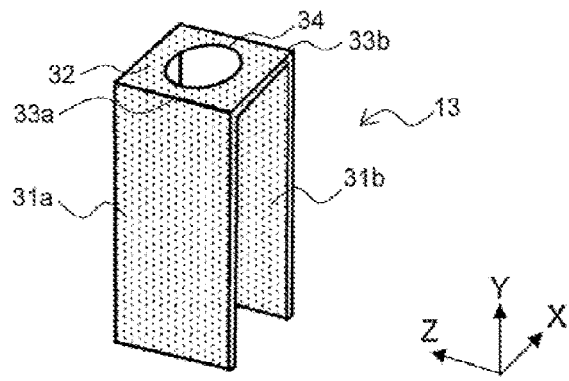
FIG. 3A is a perspective view illustrating an example of the configuration of a terminal block as illustrated in FIG. 1.
Figure 3B:
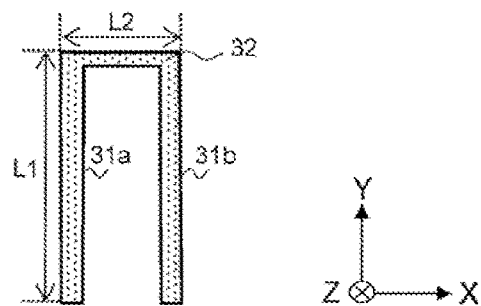
FIG. 3B is a side view of the terminal block as illustrated in FIG. 3A.
Figure 3C:
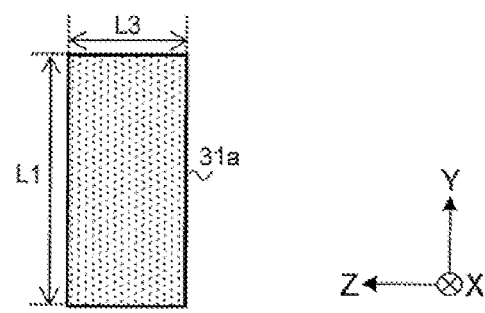
FIG. 3C is another side view of the terminal block as illustrated in FIG. 3A, which is obtained as seen in another direction.
Figure 3D:
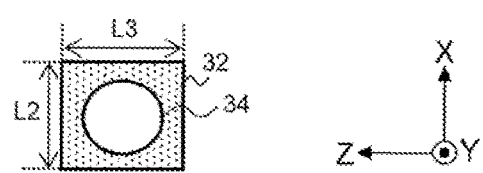
FIG. 3D is a top view of the terminal block as illustrated in FIG. 3A.

A configuration of each of the terminal blocks 13 as illustrated in FIG. 1 will be described. FIG. 3A is a perspective view illustrating an example of the configuration of a terminal block as illustrated in FIG. 1. FIG. 3B is a side view of each terminal block as illustrated FIG. 3A. FIG. 3C is a side view of the terminal block as illustrated in FIG. 3A, which is obtained as seen in another direction. FIG. 3D is a top view of the terminal block as illustrated in FIG. 3A.

As illustrated in FIG. 3A, the terminal block 13 includes a contact portion 32 and supporting portions 31a and 31b. The terminal block 13 is formed by bending a rectangular plate-shaped conductor at bend portions 33a and 33b. The supporting portions 31a and 31b face each other and are located in parallel with each other. As illustrated in FIGS. 3A and 3D, the contact portion 32 has an opening portion 34. The opening portion 34 has an inner peripheral wall in which a female screw (not illustrated) is formed.

With the contact portion 32 held in contact with the wiring pattern on the substrate surface of the second substrate 12 provided as illustrated in FIG. 1, a screw is inserted from a position located above the second substrate 12 into a hole provided in the second substrate 12, and is then fastened to the opening portion 34. When the second substrate 12 is screwed onto the terminal block 13, the contact portion 32 is electrically connected to the wiring pattern on the second substrate 12. The second substrate 12 is physically connected to the terminal block 13, and is supported by the first substrate 11, with the terminal block 13 interposed between the first and second substrates 11 and 12.

Portions of the supporting portions 31a and 31b as illustrated in FIGS. 3B and 3C that are in contact with the first substrate 11 as illustrated in FIG. 1 are electrically and physically connected to the wiring pattern (not illustrated) on the first substrate 11. The supporting portions 31a and 31b are, for example, soldered to the wiring pattern on the first substrate 11.

As illustrated in FIG. 3B, L1>L2, where L1 is the length of the terminal block 13, and L2 is the width of the contact portion 32 in an X direction indicated by an arrow X. FIG. 3C is a side view of the terminal block 13 as seen in a direction which is normal (at 90 degrees) to the direction in which it is seen in FIG. 3B. L1>L3, where L3 is the width of the contact portion 32 in a Z direction indicated by an arrow Z. The width L2 may be different from the width L3. Alternatively, the width L2 may be equal to the width L3. The first substrate 11 and the second substrate 12 are separated from each other by a distance corresponding to the length L1 of the terminal block 13, as a result of which heat transmitted through the terminal block 13 is easily dissipated into air, thus improving the heat transfer performance. It is therefore possible to reduce the temperatures of wiring lines provided on in the first and second substrates 11 and 12.

Portions of the supporting portions 31a and 31b which extend parallel to the Z direction indicated in FIG. 3C are connected to the first substrate 11 provided as illustrated in FIG. 1. The supporting portions 31a and 31b as illustrated in FIG. 3C have a higher stiffness against a force applied to the second substrate 12 in the Z direction than against a force applied to the second substrate 12 in the X direction. The greater the width L3, the higher the tolerance to a load and vibration which act in the Z direction is higher. Furthermore, the greater the width L3, the wider the current path extending through the terminal block 13, thus increasing the amount of current flowing through the terminal block 13.

Although the configuration of the terminal block 13 is described above with reference to FIGS. 3A to 3D, it is not limited to the configuration as illustrated in FIGS. 3A to 3D.

As described above with reference to FIGS. 3A to 3D, the supporting portions 31a and 31b of each of the terminal blocks 13 are electrically connected to the wiring pattern on the first substrate 11. The contact portion 32 of each of the terminal blocks 13 is electrically connected to the wiring pattern on the second substrate 12. As a result, the smoothing capacitors 3 are electrically connected, by the terminal blocks 13, to the reactor 5, the rectifier 4 and the inverter 6 which are provided at the first substrate 11. Therefore, the terminal blocks 13 are each formed to include a current path over which one or both of current flowing from the module 2 to the smoothing capacitors 3 and current flowing from the smoothing capacitors 3 to the module 2 flows. Since the first substrate 11 and the second substrate 12 are electrically connected by the terminal blocks 13, which are formed of conductors, it is possible to cause a large current (having, for example, several tens of amperes) to flow between the substrates 11 and 12.

The length of the current path between the first substrate 11 and the second substrate 12 corresponds to the length of each of the terminal blocks 13. This current path is shorter than a current path between substrates arranged side by side on the same plane. Therefore, the impedance between the substrates is reduced, thus reducing a surge voltage L (di/dt) which is generated due to the impedance.

Figure 4A:
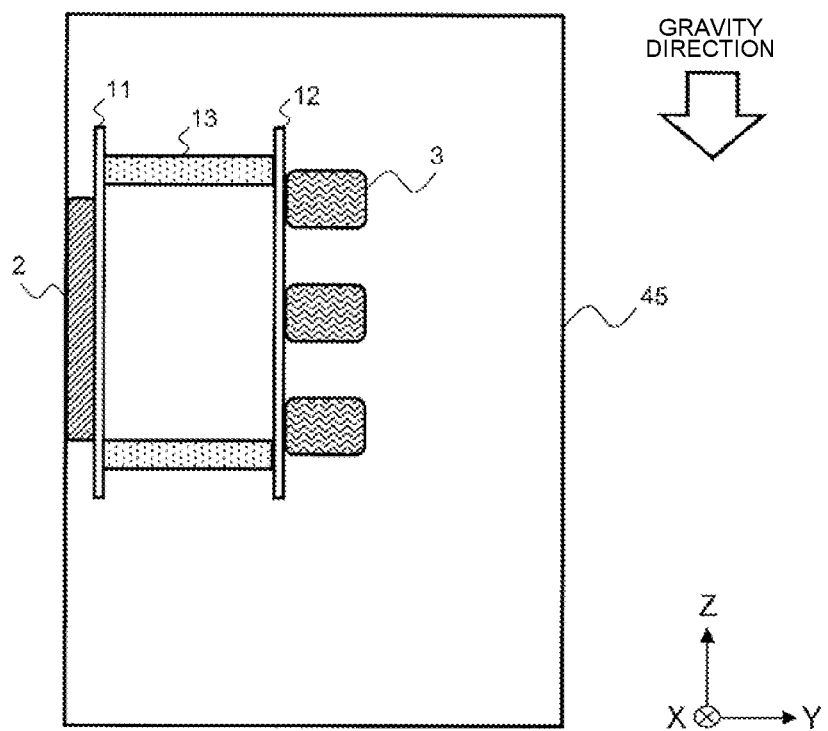
FIG. 4A is a diagram illustrating an example of a configuration in which the power converter as illustrated in FIG. 1 is attached to a control box.
Figure 4B:
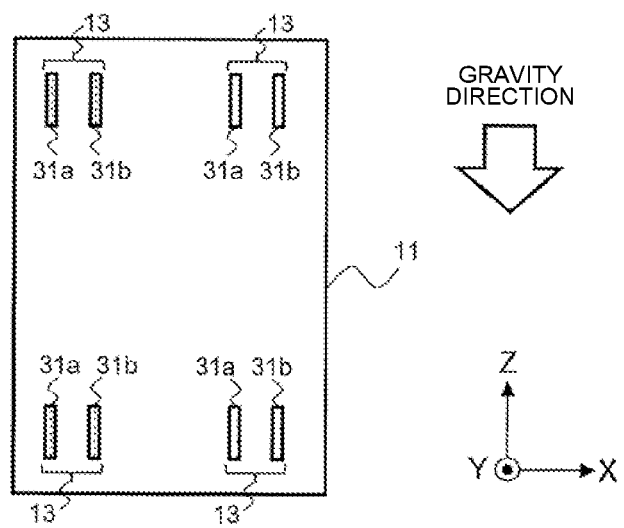
FIG. 4B is a plan view of a first substrate as illustrated in FIG. 4A.

Next, it will be described what configuration is provided in the case where the power converter 1 according to embodiment 1 is attached to, for example, a control box of an air-conditioning apparatus. FIG. 4A is a diagram illustrating an example of the configuration of the power converter of FIG. 1 attached to the control box. FIG. 4B is a plan view of the first substrate as illustrated in FIG. 4A.

As illustrated in FIG. 4A, the power converter 1 is attached to a control box 45 by attaching the first substrate 11 to a side surface of the control box 45. The first substrate 11 is fastened to the side surface of the control box 45 by, for example, screws (not illustrated). As illustrated in FIG. 4A, loads of the second substrate and the smoothing capacitors 3 acts on the terminal blocks 13 due to gravity in the direction of gravity (the opposite direction to the Z direction).

FIG. 4B illustrates portions of the supporting portions 31a and 31b of the terminal blocks 13 that are in contact with the substrate surface of the first substrate 11. As illustrated in FIG. 4B, the portions of the supporting portions 31a and 31b of the terminal blocks 13 that are in contact with the first substrate 11 are parallel to the direction of gravity. Therefore, as described above with reference to FIG. 3C, the terminal blocks 13 have a high stiffness against a force acting in the direction of gravity. As a result, the terminal blocks 13, which are located to extend in the direction as illustrated in FIG. 4B, have a greater support capacity in the direction of gravity than a support capacity in any other direction, and have a high tolerance to a gravity load.

As illustrated in FIG. 4A, the power converter 1 is attached to the control box 45 such that the substrate surfaces of the first and second substrates 11 and 12 are parallel to the direction of gravity, thereby allowing heat generated from these substrates to escape upwards (in the Z direction). It is therefore possible to reduce raising of the temperatures of the substrates. For example, if a power converter is attached to a control box such that substrate surfaces of two substrates are parallel to ground, heat generated from the lower one of the substrates is easily transmitted through air to the other, that is, the upper one, as a result of which the temperature of the upper substrate is raised. In contrast, in the configuration as illustrated in FIG. 4A, transmission of heat from the first substrate 11 to the second substrate 12 through air is reduced.

Furthermore, as illustrated in FIG. 4A, the power converter 1 is attached to the control box 45 such that the substrate surfaces of the first and second substrates 11 and 12 are perpendicular to the ground. Therefore, the areas of these substrates do not greatly influence the area required for providing the power converter 1. It is therefore possible to achieve a saving in the area for providing the power converter 1 in the control box 45.

(Modification 1)

Figure 5:
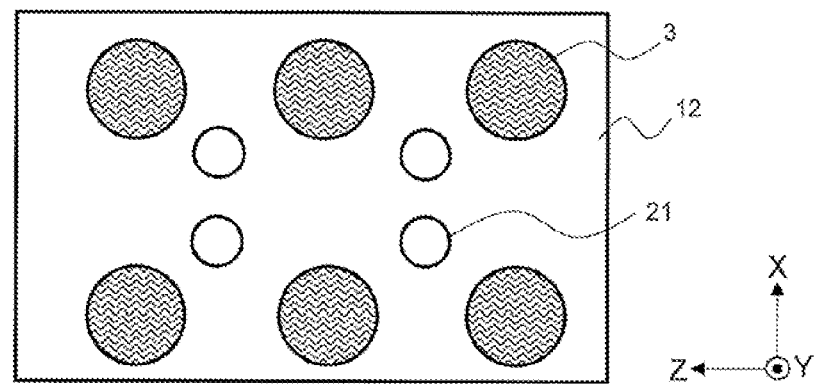
FIG. 5 is a plan view of a second substrate in modification 1 of the power converter 1 according to embodiment 1 of the present invention.

Modification 1 of the power converter 1 according to embodiment 1 will be described. FIG. 5 is a plan view of a second substrate in modification 1 of the power converter 1 according to embodiment 1 of the present invention.

In the power converter 1 as illustrated in FIG. 1, the second substrate 12 is separated from the first substrate 11 in a direction perpendicular to the substrate surface of the first substrate 11. Therefore, after the second substrate 12 is attached to the terminal blocks 13, it is therefore difficult for an operator to handle the substrate surface of the first substrate 11 to, for example, screw or unscrew the first substrate 11 to or from the control box 45. In modification 1, as illustrated in FIG. 5, holes 21 are provided to extend through the second substrate 12. In an example of the configuration as illustrated in FIG. 5, four holes 21 are provided in positions between the smoothing capacitors 3. In order to screw the first substrate 11 to the control box 45, preferably, two or more holes 21 should be provided.

In the first substrate 11, screw holes (not illustrated) are provided to face the holes 21 provided as illustrated in FIG. 5. The operator can insert a driver into any of the holes 21 to screw or unscrew the first substrate 11 to or from the control box 45, with the first and second substrates 11 and 12 held in their connected state by the terminal blocks 13.

It is more convenient that in the substrate surface of the second substrate 12, the holes 21 are located inward of the smoothing capacitors 3 as in the example of the configuration as illustrated in FIG. 5 than in a configuration in which the holes 21 are located outward of the smoothing capacitors 3. This is because the operator can touch a region of the first substrate 11, that corresponds to a region located outward of the array of the smoothing capacitors 3, through space between the first substrate 11 and the second substrate 1; however, it is hard for the operator 2 to touch a region of the first substrate 11, that corresponds to a region located inward of the array of the smoothing capacitors 3, through the space between the two substrates. Furthermore, the positions of the holes 21 will be described with reference to FIG. 1. Preferably, the holes 21 should be located inward of the terminal blocks 13, at the substrate surface of the second substrate 12. This is because the terminal blocks 13 interfere with the approach of the operator to the region of the first substrate 11, that corresponds to the region located inward of the array of the terminal blocks 13.

Although referring to FIG. 5, four holes 21 is provided in the second substrate 12, the number of holes 21 is not limited to four. The number of holes 21 in the second substrate 12 may be one. Furthermore, the positions of the holes 21 in the second substrate 12 are not limited to those as illustrated in FIG. 5. In addition, the holes 21 may be used to screw or unscrew the module 2 to or from the first substrate 11.

The operator's purpose of approaching the substrate surface of the first substrate 11 through the holes 21 provided as illustrated in FIG. 5 is not limited to fastening or unfastening the screw. The holes 21 may be used to, for example, adjust an output of a circuit element provided on the first substrate 11.

(Modification 2)

Figure 6A:
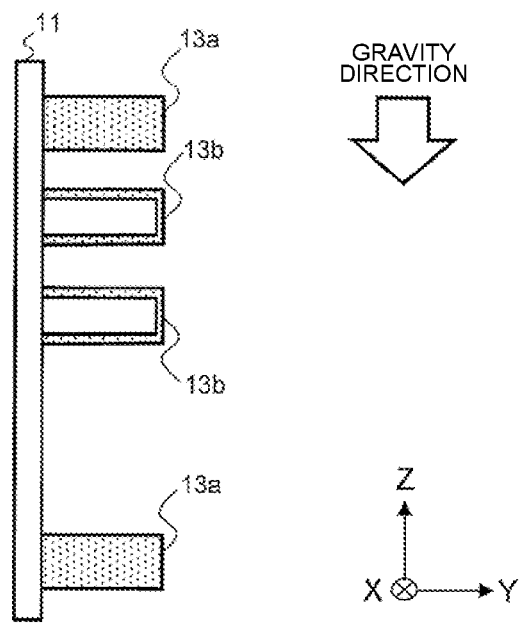
FIG. 6A is a diagram illustrating a configuration of modification 2 of the power converter according to embodiment 1 of the present invention.
Figure 6B:
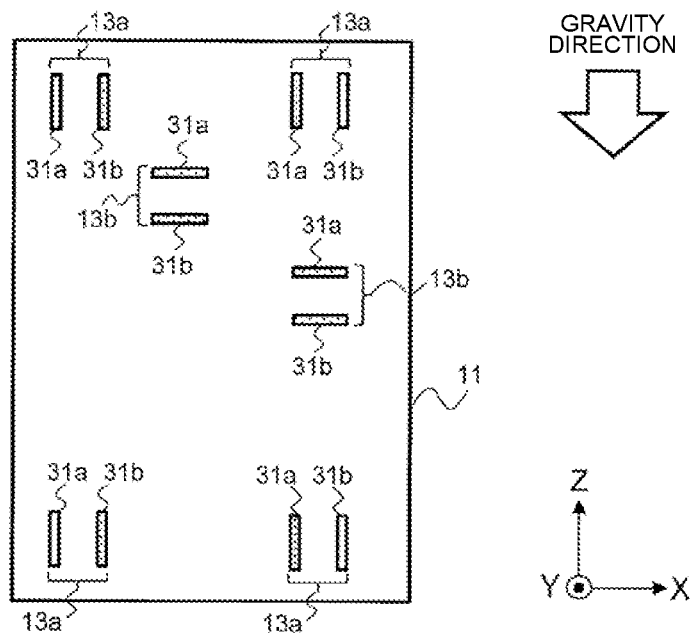
FIG. 6B is a plan view of a first substrate as illustrated in FIG. 6A.

Modification 2 of the power converter 1 according to embodiment 1 will be described. FIG. 6A is a diagram illustrating a configuration of modification 2 of the power converter according to embodiment 1 of the present invention. FIG. 6B is a plan view of a first substrate as illustrated in FIG. 6A. In FIG. 6A, depiction of components which are the same as those in the power converter 1 as illustrated in FIG. 1 except the first substrate 11 and the terminal blocks 13 is omitted. The following description is made by referring to the case where the power converter 1 is attached to a side surface of the control box 45.

The power converter 1 of modification 2 includes, as the terminal blocks 13, first terminal blocks 13a and second terminal blocks 13b. As illustrated in FIGS. 6A and 6B, the first terminal blocks 13a are arranged in a first direction (the Z direction) such that the supporting portions 31a and 31b are parallel to each other, in the same way as the terminal blocks 13 in FIG. 4B. As described with reference to FIG. 3C, the support capacity of the first terminal blocks 13a in the first direction is greater than that of the first terminal blocks 13a in a second direction (the X direction) which is parallel to the substrate surface of the first substrate 11 and perpendicular to the first direction. Furthermore, the second terminal blocks 13b are arranged such that the supporting portions 31a and 31b are arranged in the second direction and parallel to each other. Therefore, the support capacity of the second terminal blocks 13b in the second direction is greater than the support capacity of the second terminal blocks 13b in the first direction.

In modification 2, as the terminal blocks 13 mounted on the first substrate 11, the first terminal blocks 13a and the second terminal blocks 13 are provided, and the first terminal blocks function to support the second substrate 12, and the second terminal blocks 13b function to improve the tolerance to a vibration occurring in the second direction. By virtue of provision of the first terminal blocks 13a, the power converter 1 is tolerant to a vibration occurring in a direction perpendicular to the ground, and by virtue of provision of at least one second terminal block 13b, the power converter 1 is also tolerant to a vibration occurring in a horizontal direction parallel to the ground.

In modification 2, it is preferable that the number of first terminal blocks 13a be greater than that of second terminal blocks 13b. This is because in the power converter 1 attached to the side surface of the control box 45 as illustrated in FIG. 6A, a gravity load of the second substrate 12 including the smoothing capacitors 3 acts at all times on the first terminal blocks 13a and the second terminal blocks 13b in the gravity direction. FIG. 6B illustrates four first terminal blocks 13a and two second terminal blocks 13b. However, the numbers of terminal blocks are not limited to those as illustrated in FIG. 6B as long as the number of first terminal blocks 13a is greater than the number of second terminal blocks 13b.

Modification 2 is described above by referring to the case where the angle between the first direction and the second direction is 90 degrees. However, the angle is not limited to 90 degrees. It suffices that the second terminal blocks 13b are provided on the first substrate 11 such that the supporting portions 31a and 31b of the second terminal blocks 13b are parallel to a direction in which vibration can occur.

Also, embodiment 1 is described above by referring to the case where the power converter 1 is attached to the side surface of the control box 45 such that the substrate surfaces of the first and second substrates 11 and 12 are parallel to the direction of gravity. However, the power converter may be attached to the control box such that the substrate surfaces of the two substrates are parallel to the ground. In this case, the power converter is more tolerant to a vibration occurring in a lateral direction (the X direction) on a plane parallel to the ground, and also to a vibration occurring in a longitudinal direction (the Y direction) on the plane.

Furthermore, although in the description concerning embodiment 1, it is explained that a plurality of terminal blocks 13 are provided, the number of terminal blocks 13 may be one. Also, it suffices that a connector is used to connect current paths over which small current flows. In the case of providing two terminal blocks 13, a physical connection between the first substrate 11 and the second substrate 12 is stable. In the case of providing three or more terminal blocks 13, that between the substrates is more stable.

The power converter 1 according to embodiment 1 includes: the first substrate 11 on which the module 2 including the switching elements is mounted; the second substrate 12 on which the smoothing capacitors 3 are mounted; and the terminal blocks 13 which connect the first and second substrates 11 and 12, with the substrates located to face each other, and each of which includes the current path over which at least one of the current flowing from the module 2 to the smoothing capacitors 3 and the current flowing from the smoothing capacitors 3 to the module 2 flows.

In embodiment 1, the second substrate 12 is provided to face the first substrate 11, and these substrates are connected by the terminal blocks 13. It is therefore possible to cause a large current to flow between the substrates through the terminal blocks 13, and in addition reduce the length of the current paths between the substrates. As a result, the impedance between the substrates is reduced, thus also reducing a surge voltage L (di/dt) which is generated due to the impedance.

As described with respect to embodiment 1, since space corresponding to the length of the terminal blocks 13 is provided between the substrates, heat transmitted from the wiring patterns on the substrates to the terminal blocks 13 are dissipated into air, thus improving the heat transfer performance. As a result, the temperatures of the wiring patterns on the substrates can be reduced. Furthermore, the smoothing capacitors 3, which are sensitive to thermal stress, can be separated from the module 2, which radiates heat, thus increasing the life of the smoothing capacitors 3. In other words, devices formed at a wide bandgap semiconductor, such as SiC, which is tolerant to a high temperature, can be used as circuit elements mounted on the first substrate 11, and a low loss can also be achieved in addition to increasing of the life of the smoothing capacitors 3.

In embodiment 1, the terminal blocks 13 may include first terminal blocks 13a which have a greater support capacity in the first direction than a support capacity in the second direction, and second terminal blocks 13b which have a greater support capacity in the second direction than a support capacity in the first direction. Because of provision of the first terminal blocks 13a, the terminal blocks 13 are tolerant to a vibration occurring in the first direction, and because of provision of at least one second terminal block 13b, the terminal blocks 13 are also tolerant to a vibration occurring in the second direction. In the case where the angle between the first direction and the second direction is 90 degrees, the power converter 1 can be tolerant to disturbance such as vertical and horizontal vibrations.

In embodiment 1, the terminal blocks 13 may be oriented on the first substrate 11 to have a greater support capacity in the first direction than a support capacity in any other direction. In this case, even if a force is applied to the second substrate mainly in the first direction, the terminal blocks 13 are tolerant to the force applied in the first direction, that is, their tolerance to the force applied in the first direction is high. In the case where the first direction is the gravity direction, the support capacity of the terminal blocks 13 against a gravity load of the second substrate 12 is great.

Furthermore, in embodiment 1, in the second substrate 12, the holes 21 may be provided to extend therethrough. In this case, the operator can screw or unscrew the first substrate 11 through the holes 21 to or from an object, with the first substrate 11 and the second substrate 12 held connected by the terminal blocks 13. As a result, the workability is improved, and the serviceability to customers is improved.

Embodiment 2

Figure 7:
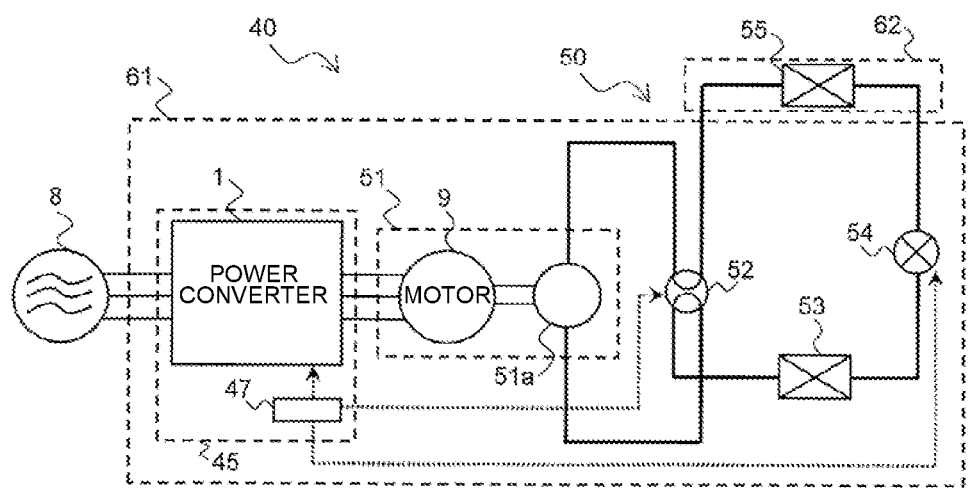
FIG. 7 is a refrigerant circuit diagram illustrating an example of the configuration of a refrigeration cycle apparatus according to embodiment 2 of the present invention.

A refrigeration cycle apparatus 40 according to embodiment 2 will be described. FIG. 7 is a refrigerant circuit diagram illustrating an example of the configuration of the refrigeration cycle apparatus according to embodiment 2 of the present invention. The refrigeration cycle apparatus 40 according to embodiment 2 includes the power converter 1 according to embodiment 1. In embodiment 2, components which are the same as those in embodiment 1 will be denoted by the same reference signs, and their detailed descriptions will be omitted. Embodiment 2 will be described mainly by referring to the differences between embodiments 1 and 2.

The refrigeration cycle apparatus 40 is, for example, an air-conditioning apparatus. As illustrated in FIG. 7, the refrigeration cycle apparatus 40 includes the power converter 1, a refrigerant circuit 50 and the control box 45. The control box 45 includes the power converter 1 and a controller 47. The refrigerant circuit 50, through which refrigerant is circulated, includes a compressor 51, a four-way valve 52, a heat-source-side heat exchanger 53, an expansion device 54 and a load-side heat exchanger 55, which are supplied with power from the power converter 1 and are connected by refrigerant pipes. The power converter 1, the compressor 51, the four-way valve 52, the heat-source-side heat exchanger 53 and the expansion device 54 are provided in an outdoor unit 61. The load-side heat exchanger 55 is provided in an indoor unit 62.

The controller 47 is, for example, a microcomputer. The controller 47 controls the power converter 1, the four-way valve 52 and the expansion device 54 on the basis of an operation state. In addition to these components, the controller 47 may control a fan (not illustrated).

The compressor 51 includes a compressing element 51a which compresses refrigerant, and the motor 9 which causes the compressing element 51a to operate. The motor 9 is connected to the power converter 1. The motor 9 is driven by an AC voltage applied from the power converter 1. The four-way valve 52 switches, between flow directions, a flow direction of the refrigerant in the refrigerant circuit 50. The refrigeration cycle apparatus 40 can perform either a cooling operation or a heating operation in accordance with switching between refrigerant passages which is performed by the four-way valve 52. The heat-source-side heat exchanger 53 causes heat exchange to be performed between the refrigerant and outdoor air. The expansion device 54 expands the refrigerant and reduces the pressure of the refrigerant. The load-side heat exchanger 55 causes heat exchange to be performed between the refrigerant and indoor air, for example.

Operations of the refrigeration cycle apparatus 40 will be described. First, the cooling operation will be described. The compressor 51 sucks the refrigerant, compresses the refrigerant to change it into a high-temperature, high-pressure gas refrigerant, and then discharges the high-temperature, high-pressure gas refrigerant. The refrigerant discharged from the compressor 51 passes through the four-way valve 52, and flows into the heat-source-side heat exchanger 53. The heat-source-side heat exchanger 53 causes heat exchange to be performed between the outdoor air and the refrigerant having flowed into the heat-source-side heat exchanger, thus condensing the refrigerant. The condensed refrigerant flows into the expansion device 54. The expansion device 54 expands the condensed refrigerant and reduces the pressure of the refrigerant to change the refrigerant into a two-phase gas-liquid refrigerant. The two-phase gas-liquid refrigerant flows into the load-side heat exchanger 55. The load-side heat exchanger 55 causes heat exchange to be performed between the indoor air and the refrigerant having flowed into the load-side heat exchanger, thus evaporating the refrigerant. At this time, the indoor air is cooled, thus cooling an indoor space. Also, when the refrigerant is evaporated, it changes into a low-temperature, low-pressure gas refrigerant. The low-temperature, low-pressure gas refrigerant passes through the four-way valve 52 and is then sucked into the compressor 51. In the case where the cooling operation is performed, the heat-source-side heat exchanger 53 functions as a condenser and the load-side heat exchanger 55 functions as an evaporator.

Next, the heating operation will be described. The compressor 51 sucks the refrigerant, compresses the refrigerant to change it into a high-temperature, high-pressure gas refrigerant, and then discharges the high-temperature, high-pressure gas refrigerant. The high-temperature, high-pressure gas refrigerant discharged from the compressor 51 passes through the four-way valve 52 and flows into the load-side heat exchanger 55. The load-side heat exchanger 55 causes heat exchange to be performed between the refrigerant having flowed into the load-side heat exchanger and the indoor air, thus condensing the refrigerant. At this time, the indoor air is heated, thus heating the indoor space. The condensed refrigerant flows into the expansion device 54. The expansion device 54 expands the condensed refrigerant and reduces the pressure of the refrigerant to change the refrigerant into a two-phase gas-liquid refrigerant. The two-phase gas-liquid refrigerant flows into the heat-source-side heat exchanger 53. The heat-source-side heat exchanger 53 causes heat exchange to be performed between the outdoor air and the refrigerant having flowed into the heat-source-side heat exchanger, thus evaporating the refrigerant to change it into a low-temperature, low-pressure gas refrigerant. The low-temperature, low-pressure gas refrigerant passes through the four-way valve 52 and is then sucked into the compressor 51. In the case where the cooling operation is performed, the heat-source-side heat exchanger 53 functions as an evaporator and the load-side heat exchanger 55 functions as a condenser.

In the refrigeration cycle apparatus 40 according to embodiment 2, the motor 9 of the compressor 51 is driven by an AC voltage applied from the power converter 1 according to embodiment 1. It is therefore possible to obtain the same advantages as in embodiment 1.

For example, in the case where the power converter 1 is attached to the side surface of the control box 45 as illustrated in FIG. 4A, it is possible to improve the tolerance to a gravity load of the second substrate 12 and the smoothing capacitors 3 as in embodiment 1. Furthermore, it is possible to cause heat generated from the first substrate 11 to dissipate upwards through the space between the substrates. In addition, for example, in the case where the terminal blocks 13 are oriented on the first substrate 11 to have greater support capacities in different directions as in arrangement of the first and second terminal blocks 13a and 13b in FIG. 6A, they can maintain tolerance to a gravity load, and have improved tolerance to a horizontal vibration parallel to the ground.

In the example as illustrated in FIG. 6, the power converter 1 according to embodiment 1 is connected to the motor 9 of the compressor 51 in the air-conditioning apparatus, which is the refrigeration cycle apparatus 40. However, the power converter 1 may be connected to a motor 9 in a refrigeration cycle apparatus 40 such as a heat pump apparatus or a refrigerating apparatus.

REFERENCE SIGNS LIST 1 power converter 2 module 3 smoothing capacitor 4 rectifier 5 reactor 6 inverter 8 power supply 9 motor 11 first substrate 12 second substrate 13 terminal block 13a first terminal block 13b second terminal block 21 hole 31a, 31b supporting portion 32 contact portion 33a, 33b bend 34 opening portion 40 refrigeration cycle apparatus 45 control box 47 controller refrigerant circuit 51 compressor 51a compressing element 52 four-way valve 53 heat-source-side heat exchanger 54 expansion device 55 load-side heat exchanger 61 outdoor unit 62 indoor unit

The invention claimed is:

1. A power converter comprising:
a first substrate on which a module including a switching element is mounted;
a second substrate on which a smoothing capacitor is mounted; and
a plurality of terminal blocks each connecting the first substrate and the second substrate, with the first substrate and the second substrate located to face each other, each of the terminal blocks including a current path over which at least one of current flowing from the module to the smoothing capacitor and current flowing from the smoothing capacitor to the module flows, the plurality of terminal blocks including
a first terminal block having a greater support capacity in a first direction than a support capacity in a second direction different from the first direction, and
a second terminal block having a greater support capacity in the second direction than a support capacity in the first direction.

2. The power converter of claim 1, wherein the first direction is a direction of gravity.

3. A power converter comprising:
a first substrate on which a module including a switching element is mounted;
a second substrate on which a smoothing capacitor is mounted; and
a plurality of terminal blocks each connecting the first substrate and the second substrate, with the first substrate and the second substrate located to face each other, each of the terminal blocks including a current path over which at least one of current flowing from the module to the smoothing capacitor and current flowing from the smoothing capacitor to the module flows,
the plurality of terminal blocks being oriented on the first substrate to have a greater support capacity in a first direction than a support capacity in any of directions other than the first direction.

4. An air-conditioning apparatus comprising:
a power converter comprising
a first substrate on which a module including a switching element is mounted;
a second substrate on which a smoothing capacitor is mounted; and
a terminal block connecting the first substrate and the second substrate, with the first and second substrates located to face each other, the terminal block including a current path over which at least one of current flowing from the module to the smoothing capacitor and current flowing from the smoothing capacitor to the module flows, the terminal block being soldered to the first substrate, and screwed on the second substrate;
a compressor which is supplied with power from the power converter; and
a refrigerant circuit including the compressor, a condenser, an expansion device, and an evaporator, which are connected by refrigerant pipes.

5. The air-conditioning apparatus of claim 4, wherein the second substrate has a hole extending therethrough.

6. The air-conditioning apparatus of claim 4, wherein the switching element is formed in a wide bandgap semiconductor.

7. The air-conditioning apparatus of claim 4, further comprising:
a control box including the power converter,
wherein the first substrate is attached to the control box such that a substrate surface of the first substrate is parallel to a direction of gravity.

8. The air-conditioning apparatus of claim 4, wherein the terminal block is formed by bending a plate-shaped conductor.

9. An air-conditioning apparatus comprising:
a power converter comprising:
a first substrate on which a module including a switching element is mounted;
a second substrate on which a smoothing capacitor is mounted; and
a terminal block connecting the first substrate and the second substrate, with the first substrate and the second substrate located to face each other, the terminal block including a current path over which at least one of current flowing from the module to the smoothing capacitor and current flowing from the smoothing capacitor to the module flows, the terminal block is formed by bending a plate-shaped conductor;
a compressor which is supplied with power from the power converter; and a refrigerant circuit including the compressor, a condenser, an expansion device, and an evaporator, which are connected by refrigerant pipes.

* * * * *